United States Patent [19]
Dell'Ova et al.

[11] Patent Number: 5,867,066
[45] Date of Patent: Feb. 2, 1999

[54] CURRENT AMPLIFIER

[75] Inventors: Francis Dell'Ova, Saint Hilaire Du Touvet; Bruno Bonhoure; Frédéric Paillardet, both of Grenoble, all of France

[73] Assignee: SGS-Thomson Microelectronics S.r.l., Agrate Brianza, Italy

[21] Appl. No.: 631,733

[22] Filed: Apr. 11, 1996

[30] Foreign Application Priority Data

Apr. 11, 1995 [FR] France ................................. 95 04609

[51] Int. Cl.$^6$ ............................................. H03F 3/08
[52] U.S. Cl. ........................................ 330/288; 330/308
[58] Field of Search .......................... 330/59, 110, 288, 330/308, 310, 311; 250/214 A

[56] References Cited

U.S. PATENT DOCUMENTS

| | | | |
|---|---|---|---|
| 3,801,933 | 4/1974 | Teare | 330/35 |
| 4,507,573 | 3/1985 | Nagano | 307/297 |
| 4,855,618 | 8/1989 | Brokaw | 330/288 X |
| 5,079,518 | 1/1992 | Wakayama | 330/288 |
| 5,216,386 | 6/1993 | Wyatt | 330/308 |
| 5,254,957 | 10/1993 | Lauffenburger | 330/308 |

FOREIGN PATENT DOCUMENTS

| | | |
|---|---|---|
| 0 306 798 | 3/1989 | European Pat. Off. . |
| A-0 383 397 | 8/1990 | European Pat. Off. . |
| A-31 40956 | 5/1983 | Germany . |
| 9219039 | 10/1992 | WIPO . |

*Primary Examiner*—Steven Mottola
*Attorney, Agent, or Firm*—David V. Carlson; Michael J. Donohue

[57] ABSTRACT

A current amplifier includes a cascode transistor for fixing the voltage of an input of the amplifier; a first constant current source connected between the input and a first supply voltage; a second constant current source, for providing a current lower than the first current source, connected between a second supply voltage and the cascode transistor; a second transistor, of different type than the cascode transistor, connected between the input and the second supply voltage, and controlled by the node between the cascode transistor and the second current source; and an output transistor of same type as the second transistor, connected to the second supply voltage and controlled by the node.

19 Claims, 3 Drawing Sheets

5,867,066

CURRENT AMPLIFIER

FIELD OF THE INVENTION

The present invention relates to current amplifiers, and more particularly to amplifiers for amplifying low currents with a large band-width.

BACKGROUND OF THE INVENTION

FIG. 1 represents such a current amplifier in a conventional application. The current to be amplified i is provided to an input A of the amplifier through a photodiode D connected to a supply voltage Vcc. When the photodiode D is, for example, used in a compact disk (CD) read head 2, the variations in the light intensity, and therefore the variations in the current of photodiode D, are very low. The maximum value of current i is approximately 3 $\mu$A. Furthermore, current i may vary at a frequency of approximately 1.5 MHz.

A parasitic capacitance Cp1 is present between the input A of amplifier 10 and ground GND, and a parasitic capacitance Cp2 is present between the input A and the supply voltage Vcc. These two parasitic capacitances Cp1 and Cp2 may significantly reduce the band-width of amplifier 10 and inject noise from the supply voltages in the input. To avoid these drawbacks, the input impedance of amplifier 10 must be reduced or, in other terms, the voltage of the input must be as steady as possible.

FIG. 2 represents an exemplary conventional current amplifier providing satisfactory performance for the photodiode D of the CD read head 2.

In practice, the current amplifier 10 is a current mirror with bipolar transistors. An NPN transistor Q1 forms the input transistor of the current mirror. The emitter of transistor Q1 is connected to ground GND and its base and collector receive from the photodiode D the current i to amplify. Furthermore, a constant current source 12, connected in parallel with diode D, provides a bias current I. An NPN transistor Q2, forming an output transistor of the current mirror, is connected in parallel by its base and emitter to transistor Q1. The output current of the amplifier is drawn from the collector of transistor Q2. The emitter areas of transistors Q1 and Q2 are indicated in brackets. Transistor Q1 has a unity area and transistor Q2 has an area n. Thus, the current i in photodiode D is amplified by a factor n at the collector of transistor Q2.

Such a current amplifier, formed of bipolar transistors, has an input impedance of approximately 1 k$\Omega$, which is sufficient to amplify currents of approximately 3 $\mu$A with a bandwidth of approximately 1.5 MHz in common cases where the parasitic capacitances are relatively low.

The digital circuits for processing the signal provided by the photodiode D, in particular for CD's, are generally realized in CMOS technology, which is inexpensive and well adapted to digital processing.

The performance of a current mirror realized in CMOS technology is insufficient to amplify low currents with a large band-width. So, in CD players, the current amplifiers of the photodiodes of the read heads are realized in bipolar technology and cannot be integrated in the same circuit as the signal processing circuit.

SUMMARY OF THE INVENTION

An object of the present invention is to provide a current amplifier having a very low input impedance.

Another object of the present invention is to realize such a current amplifier in CMOS technology.

These objects are achieved with a current amplifier including a cascode transistor for fixing the voltage of an input of the amplifier; a first constant current source connected between the input and a first supply voltage; a second constant current source, for providing a current lower than the first current source, connected between a second supply voltage and the cascode transistor; a second transistor, of different type than the cascode transistor, connected between the input and the second supply voltage, and controlled by the node between the cascode transistor and the second current source; and an output transistor of same type as the second transistor, connected to the second supply voltage and controlled by the node.

According to an embodiment of the invention, the first and second constant current sources are formed by transistors connected through a current mirror circuit.

According to an embodiment of the invention, the transistors are MOS transistors.

According to an embodiment of the invention, the input current of the amplifier is provided by a photodiode.

According to an embodiment of the invention, the photodiode is used in a CD read head, the amplifier being integrated with the circuits for processing the CD signal.

The foregoing and other objects, features, aspects and advantages of the invention will become apparent from the following detailed description of the present invention when taken in conjunction with the accompanying drawings.

DETAILED DESCRIPTION

Figure 1:
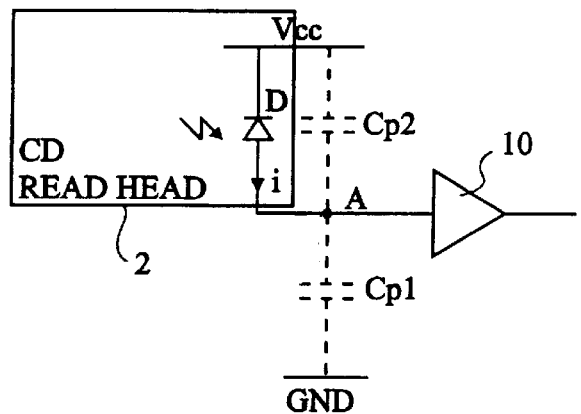
FIG. 1 represents a conventional application of a current amplifier.
Figure 2:
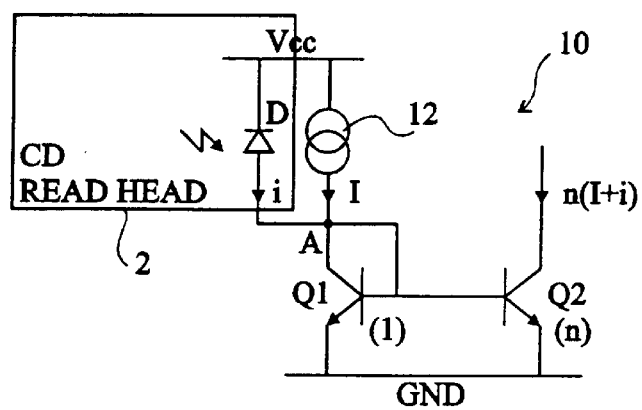
FIG. 2 represents a conventional bipolar structure of a current amplifier.
Figure 3:
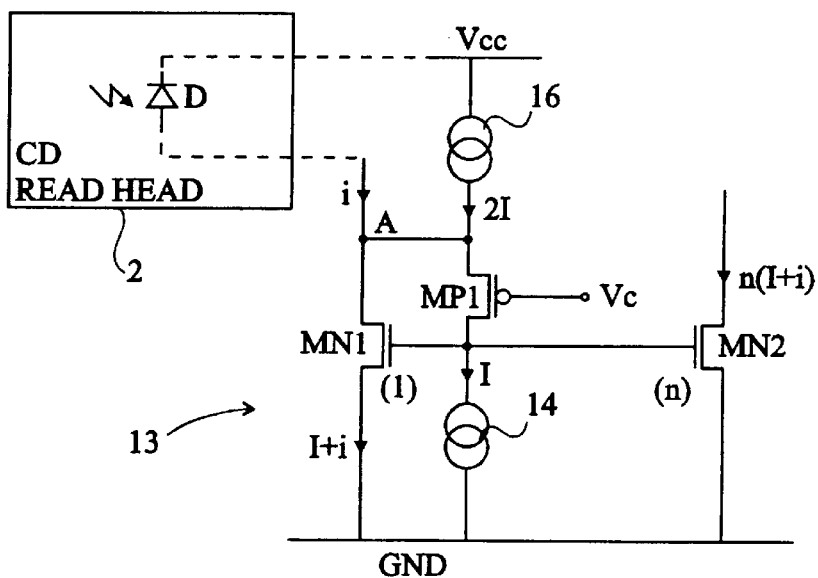
FIG. 3 represents an embodiment of a current amplifier according to the invention, that can be realized in CMOS technology.

The present invention is embodied in a current amplifier 13 shown in the schematic of FIG. 3. A current i to be amplified is provided at A to the drain of an N-channel MOS transistor MN1 having its source connected to ground GND. The gate of transistor MN1 is connected to ground GND through a constant current source 14 that sinks a current I. A P-channel MOS transistor MP1, forming a cascode transistor, is connected by its source and drain to the drain and gate, respectively, of transistor MN1. The gate of transistor MP1 receives a fixed voltage Vc. A constant current source 16 couples the source of transistor MP1 to a high supply voltage Vcc, which is a higher voltage than the fixed voltage Vc. Current source 16 provides a current, for example equal to 2I, higher than the current of current source 14. An N-channel MOS transistor MN2 is connected in parallel by its gate and source to transistor MN1. The output current of the amplifier is drawn from the drain of transistor MN2.

Current source 14 draws a current I from current source 16 through transistor MP1, and the excess current (I) of current source 16 can flow only through transistor MN1. The voltage across current source 14 (i.e., the gate-source voltage of transistor MN1) establishes at a value such that transistor MN1 absorbs the excess current I. Since transistor MN2 operates under the same conditions as transistor MN1, transistor MN2 duplicates the current of transistor MN1 at its drain. Of course, this duplication is achieved with a multiplication factor n equal to the channel width to length ratios between transistors MN2 and MN1.

Figure 4:
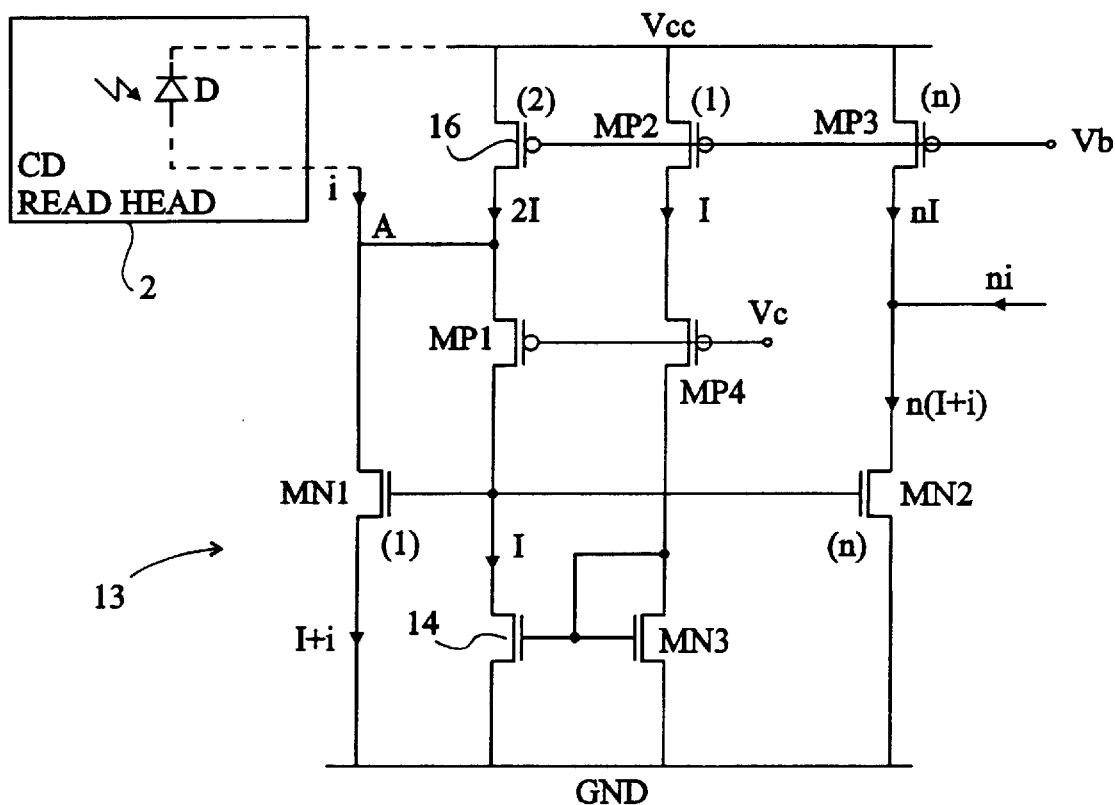
FIG. 4 represents a detailed embodiment of a current amplifier according to the invention.
Figure 5:
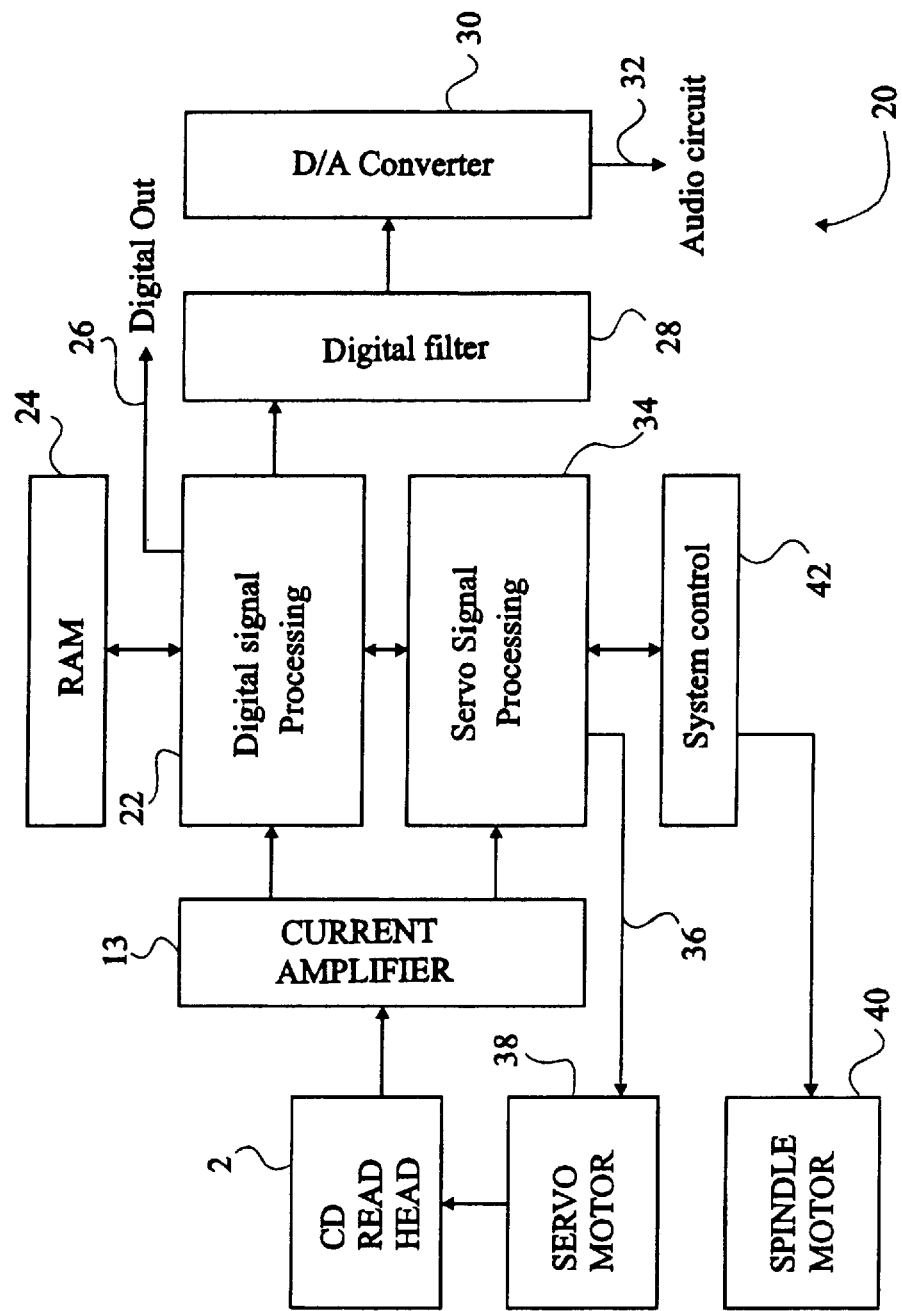
FIG. 5 is a functional block diagram of a CD system whose preamplifier uses the current amplifier of FIG. 3.

FIGS. 3 to 5 illustrate the generation of the current i in the CD read head 2 using the diode D. However, those of ordinary skill in the art will recognize that the current i can be generated by other conventional means. Thus, the present invention is not limited to current amplification of a signal from the CD read head 2. When the current i is injected into input A, the gate-source voltage of transistor MP1 tends to increase since voltage Vc is fixed. Thus, transistor MP1 becomes more conductive. Since the drain current I of transistor MP1 is constant, the voltage across current source 14 increases. This increased voltage renders transistor MN1 more conductive so as to absorb the input current i, which restores the voltage at input A substantially at its initial value. Transistor MN2 still duplicates the current of transistor MN1 thereby sinking a current n(I+i).

The input impedance of the current amplifier according to the invention was measured at approximately 100 W.

FIG. 4 represents a detailed embodiment of a current amplifier 13 according to the invention. Similar elements as in FIG. 3 are designated with same reference characters. The current source 16 is formed by a P-channel MOS transistor 16, whose source is connected to the supply voltage Vcc and whose drain provides current 2I. The gate of transistor 16 receives a bias voltage Vb. The bias voltage Vb is also applied to the gates of two other P-channel MOS transistors MP2 and MP3 that are connected in parallel with transistor 16 by their gates and sources. The channel width to length ratios of transistors 16, MP2 and MP3 are respectively 2, 1 and n, so as to provide currents 2I, I and nI, respectively.

The current I provided by transistor MP2 flows to the drain and gate of an N-channel MOS transistor MN3 having its source connected to ground GND. Transistor MN3 is the input transistor of a current mirror whose output constitutes the current source 14. This output includes an N-channel MOS transistor 14 connected in parallel with transistor MN3 by its gate and source.

In order for transistors MN3 and 14 to operate under the same conditions, transistor MN3 is coupled to transistor MP2 through a P-channel cascode transistor MP4 receiving voltage Vc at its gate, like cascode transistor MP1.

The drain of transistor MN2 receives the current nI from transistor MP3, which makes the current amplifier draw only the amplified current ni through the drain of transistor MN2.

FIG. 5 is a functional block diagram illustrating the incorporation of the current amplifier 13 into a CD drive 20. The CD read head 2, containing the photodiode D (see FIG. 4) is coupled to the current amplifier 13. The output of the current amplifier 13 is coupled to a digital signal processing circuit 22, which processes the signals in a conventional manner. The CD drive 20 includes a random access memory 24, which provides temporary data storage for the digital signal processing circuit 22. A digital out line 26 provides the direct digital data output from the digital signal processing circuit 22. Alternatively, data may be supplied to a digital buffer 28, which in turn is coupled to a digital-to-analog converter 30 to generate an analog output 32.

The CD drive 20 also includes a servo signal processing circuit 34 to provide control signals 36 to a servo motor 38. The servo motor 38 is mechanically coupled to the CD read head 2 and is used to position the CD read head in proximity with a CD (not shown). A spindle motor 40 causes the CD (not shown) to rotate within the CD drive 20. The spindle motor 40 and other components of the CD drive 20 are controlled by a system control circuit 42. Operational details of the current amplifier 13 are provided above. The operational details of the CD drive 20 are well known to those of ordinary skill in the art and need not be described herein.

The current amplifier 13 according to the invention is advantageously realized in CMOS technology, which allows its integration with a digital signal processing circuit, in particular for signals from photodiodes of a CD read head. However, for other applications, the current amplifier according to the invention can also be realized in bipolar technology.

Having thus described at least one illustrative embodiment of the invention, various alterations, modifications and improvements will readily occur to those skilled in the art. Such alterations, modifications, and improvements are intended to be within the spirit and scope of the invention. Accordingly, the foregoing description is by way of example only and is not intended to be limiting. The invention is limited only as defined in the following claims and the equivalents thereto.

We claim:

1. A current amplifier including:
    a cascode transistor for fixing the voltage of an input of the amplifier;
    a first constant current source connected between the input and a first supply voltage;
    a second constant current source, for providing a current lower than the first current source, connected between a second supply voltage and the cascode transistor;
    a second transistor, of different type than the cascode transistor, connected between the input and the second supply voltage, and controlled by the node between the cascode transistor and the second current source; and
    an output transistor of same type as the second transistor, connected to the second supply voltage and controlled by said node.

2. The current amplifier of claim 1 wherein said transistors are MOS transistors.

3. The current amplifier of claim 1 wherein the first and second constant current sources are formed by transistors connected through a current mirror circuit.

4. The current amplifier of claim 3 wherein said transistors are MOS transistors.

5. The current amplifier of claim 1, further including a photodiode to generate an input current for the current amplifier.

6. The current amplifier of claim 5, further including a CD read head including said photodiode and CD signal processing circuitry, the current amplifier and said CD signal processing circuitry being integrated onto an integrated circuit.

7. A current amplifier circuit, comprising:
    a low impedance amplifier input to receive an input current;
    a first transistor coupled to said input to set an input voltage at said input to a substantially fixed value;
    a first current source coupled between a power supply voltage and said first transistor to provide a first current;
    a second current source coupled between said first transistor and a reference voltage potential to provide a second current less than said first current;

a second transistor coupled between said input and said reference voltage potential, said second transistor having a control terminal coupled to a circuit node formed by said first transistor and said second current source; and an output current mirror coupled to said reference voltage potential and having a control terminal coupled to said circuit node to generate an amplified output current.

8. The circuit of claim 7 wherein said amplified output current is related to current conducted through said second transistor with said current conducted through said second transistor being a sum of said input current and said second current, said amplified output current being a predetermined multiple of said sum of said input current and said second current amplified output current.

9. The circuit of claim 8 wherein said second transistor has a first conduction area and said output current mirror comprises an output transistor having a second conduction area that is said predetermined multiple of said first conduction area, said second transistor conducting said sum of said input current and said second current and said output transistor mirroring said sum of said input current and said second current through said second conduction area to generate said amplified current.

10. The circuit of claim 7 wherein said current source comprises a third transistor and first and third transistors are coupled together in a cascode arrangement with said first transistor being a cascode transistor.

11. The circuit of claim 7 wherein said current mirror includes an output transistor and said first and second transistors and said output transistor are MOS transistors.

12. The circuit of claim 11 wherein said first transistor is a first MOS transistor type, said second transistor is a second MOS type, and said output transistor is said second MOS type.

13. The circuit of claim 7, further including a photodiode coupled to said input, said input current being generated by said photodiode.

14. The circuit of claim 13, further including a compact disk containing a read head, said photodiode being included in said read head to generate said input current in response to data patterns detected by said read head.

15. The circuit of claim 14, further including a signal processing circuit to receive and process said amplified current, said signal processing circuit and the current amplifier circuit being integrated into a single integrated circuit.

16. A method of amplifying a current signal, the method comprising the steps of:

a low impedance amplifier input to receive the current signal;

fixing an input voltage at a low impedance amplifier input using a first transistor coupled to said input;

providing a first current to said first transistor;

conducting a second current less than said first current from said first transistor;

conducting a current equal to the sum of the current signal and the difference between said first and second currents through a second transistor; and generating an amplified output current using an output transistor coupled to said second transistor, said amplified output current being a predetermined multiple of said current conducted through said second transistor.

17. The method of claim 16 wherein said second transistor has a first conduction area and said output transistor has a second conduction area that is said predetermined multiple of said first conduction area, said step of generating said amplified output current being performed by said output transistor mirroring said current conducted through said second transistor through said second conduction area to generate said amplified current.

18. The method of claim 16, further including the step of generating the current signal in response to data patterns detected by a read head in a compact disk.

19. The method of claim 18, further including the step of integrating a signal processing circuit and the current amplifier circuit into a single integrated circuit.

* * * * *

UNITED STATES PATENT AND TRADEMARK OFFICE
CERTIFICATE OF CORRECTION

PATENT NO      : 5,867,066
DATED          : February 2, 1999
INVENTOR(S)    : Francis Dell'Ova et al.

It is certified that error appears in the above-identified patent and that said Letters Patent is hereby corrected as shown below:

In field [73] denoting the Assignee, please delete:

"SGS-Thomson Microelectronics S.r.l.
Agrate Brianza, Italy"

and insert therefore:

--SGS-Thomson Microelectronics S.A.
Gentilly, France--

Signed and Sealed this

Eighth Day of August, 2000

*Attest:*

Q. TODD DICKINSON

*Attesting Officer*                *Director of Patents and Trademarks*